United States Patent
Chen et al.

(10) Patent No.: US 8,163,651 B2
(45) Date of Patent: Apr. 24, 2012

(54) METHOD OF FABRICATING SEMICONDUCTOR SUBSTRATE BY USE OF HETEROGENEOUS SUBSTRATE AND RECYCLING HETEROGENEOUS SUBSTRATE DURING FABRICATION THEREOF

(75) Inventors: Miin-Jang Chen, Taipei (TW); Wen-Ching Hsu, Hsinchu (TW); Suz-Hua Ho, Jhudong Township, Hsinchu County (TW)

(73) Assignees: Sino-American Silicon Products Inc., Hsinchu (TW); Miin-Jang Chen, Taipei (TW)

( * ) Notice: Subject to any disclaimer, the term of this patent is extended or adjusted under 35 U.S.C. 154(b) by 894 days.

(21) Appl. No.: 12/210,004

(22) Filed: Sep. 12, 2008

(65) Prior Publication Data

US 2009/0075481 A1    Mar. 19, 2009

(30) Foreign Application Priority Data

Sep. 14, 2007   (TW) ............................... 96134398 A

(51) Int. Cl.
*H01L 21/311*   (2006.01)

(52) U.S. Cl. .......... 438/694; 438/46; 438/689; 438/690; 216/37; 216/67; 257/98; 257/103; 257/181; 257/185

(58) Field of Classification Search ............ 438/46, 438/689–694; 216/37, 67; 257/98, 103, 257/181, 185, 186
See application file for complete search history.

(56) References Cited

U.S. PATENT DOCUMENTS 5,557,120 A * 9/1996 Martin et al. ................ 257/291
7,008,857 B2 * 3/2006 Ghyselen et al. ............ 438/455

OTHER PUBLICATIONS

D.J. Rogers et al. Applied Physics Letters, vol. 91, (2007), pp. 071120-1-071120-3.*

* cited by examiner

*Primary Examiner* — Nadine G. Norton
*Assistant Examiner* — Maki Angadi

(57) ABSTRACT

The invention discloses a method of fabricating a first substrate and a method of recycling a second substrate during fabrication of the first substrate. The second substrate is heterogeneous for the first substrate. First, the fabricating method according to the invention is to prepare the second substrate. Subsequently, the fabricating method is to deposit a buffer layer on the second substrate. Then, the fabricating method is to deposit a semiconductor material layer on the buffer layer. The buffer layer assists the epitaxial growth of the semiconductor material layer, and serves as a lift-off layer. Finally, with an etching solution, the fabricating method is to only etch the lift-off layer to debond the second substrate away from the semiconductor material layer, where the semiconductor material layer serves as the first substrate.

7 Claims, 3 Drawing Sheets

METHOD OF FABRICATING SEMICONDUCTOR SUBSTRATE BY USE OF HETEROGENEOUS SUBSTRATE AND RECYCLING HETEROGENEOUS SUBSTRATE DURING FABRICATION THEREOF

BACKGROUND OF THE INVENTION

1. Field of the Invention

The present invention relates to a method of fabricating a semiconductor substrate and a method of recycling a heterogeneous substrate during fabrication of said semiconductor substrate.

2. Description of the Prior Art

Semiconductor light-emitting devices, such as light-emitting diodes, can be used for a wide variety of devices, e.g. optical displaying devices, traffic lights, communication devices, and illumination devices.

Up to now, a semiconductor light-emitting device is mainly grown on a sapphire substrate. The sapphire substrate is made by cutting a sapphire ingot, and the sapphire ingot is formed by a crystal pulling process. However, the crystal pulling process wastes time and costs much. As a result, if the substrate used for the fabrication of the semiconductor light-emitting device can be formed by other more efficient growing processes (e.g. an epitaxy process), then it can overcome the traditional problem in producing sapphire substrates.

On the other hand, as mentioned above, the current semiconductor light-emitting device is mainly formed on a sapphire substrate. However, it may lead to the shortage of the sapphire substrate. As a result, if the sapphire substrate can be recycled during the fabrication of the semiconductor optoelectronic device, then the sapphire substrate can be utilized again to reduce manufacture cost.

In the prior art, a semiconductor light-emitting device can be illuminated by a laser, and a lift-off layer of said semiconductor light-emitting device can be decomposed by absorbing the energy of the laser such that the substrate of the semiconductor light-emitting device can be debonded away from the semiconductor light-emitting device. However, this method costs much and is unfavorable in practical applications.

Therefore, to solve the aforementioned problem, the main scope of the invention is to provide a method of fabricating a first substrate and a method of recycling a second substrate during fabrication of the first substrate.

SUMMARY OF THE INVENTION

One scope of the invention is to provide a method of fabricating a first substrate and a method of recycling a second substrate during fabrication of the first substrate.

It is related to a method of fabricating a first substrate according to an embodiment of the invention. First, a second substrate is prepared. Subsequently, a buffer layer is deposited on the second substrate. Then, a semiconductor material layer is deposited on the buffer layer. The buffer layer assists the epitaxial growth of the semiconductor material layer, and the buffer layer also serves as a lift-off layer. Finally, with an etching solution, only the lift-off layer is etched to debond the second substrate away from the semiconductor material layer, wherein the semiconductor material layer serves as the first substrate.

It is related to a method of recycling a second substrate during fabrication of a first substrate according to another embodiment of the invention. A buffer layer is deposited on the second substrate, and a semiconductor material layer is deposited on the buffer layer. The buffer layer assists the epitaxial growth of the semiconductor material layer and also serves as a lift-off layer.

In the method, by an etching solution, only the lift-off layer is etched to debond the second substrate away from the semiconductor material layer, and further to recycle the second substrate, wherein the semiconductor material layer severs as the first substrate.

Compared to the prior art, according to the method of the invention, only the lift-off layer can be etched by the etching solution to debond the second substrate away from the semiconductor material layer, wherein the second substrate can further be recycled, and the semiconductor material layer can sever as the first substrate for production of a semiconductor optoelectronic device. Preferably, the recycling of the second substrate can reduce the manufacture cost and economize the use of materials.

The advantage and spirit of the invention may be understood by the following recitations together with the appended drawings.

BRIEF DESCRIPTION OF THE APPENDED DRAWINGS

DETAILED DESCRIPTION OF THE INVENTION

Please refer to FIGS. 1A through 1D. FIGS. 1A through 1D are sectional views illustrating a method of fabricating a first substrate in accordance with an embodiment of the invention.

Figure 1A:
FIGS. 1A through 1D are sectional views illustrating a method of fabricating a first substrate in accordance with an embodiment of the invention.

First, as shown in FIG. 1A, a second substrate 10 is prepared. In an embodiment, the second substrate 10 can be a semiconductor substrate, and the second substrate 10 is a heterogeneous substrate relative to the first substrate.

In practical applications, the second substrate 10 can be made of sapphire, Si, SiC, GaN, ZnO, $ScAlMgO_4$, YSZ (Yttria-Stabilized Zirconia), $SrCu_2O_2$, $LiGaO_2$, $LiAlO_2$, GaAs, and the like. In this embodiment, the second substrate 10 can be a sapphire substrate 10.

Figure 1B:
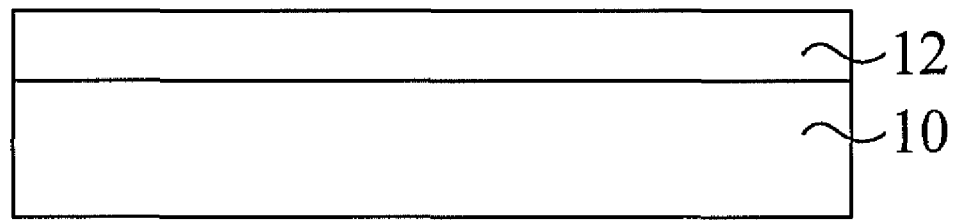

Subsequently, as shown in FIG. 1B, a buffer layer 12 is deposited on the second substrate 10.

In practical applications, the buffer layer 12 can be made of ZnO or $Mg_xZn_{1-x}O$, where $0<x\leq1$. The buffer layer 12 may have a thickness in a range of 10 nm to 500 nm.

In practical applications, the buffer 12 layer can be deposited by a sputtering process, an MOCVD (metalorganic chemical vapor deposition) process, an atomic layer deposition process, a plasma-enhanced atomic layer deposition process, or a plasma-assisted atomic layer deposition process.

In one embodiment, if the buffer layer 12 is deposited by the atomic layer deposition process, then the deposition of the buffer layer 12 can be performed at a processing temperature ranging from room temperature to 600° C. The buffer layer 12 can be further annealed at a temperature ranging from 400° C. to 1200° C. after deposition.

In one embodiment, if the buffer layer 12 is deposited by the atomic layer deposition process and the buffer layer 12 is formed of ZnO, then the precursors of the buffer layer 22 of ZnO can be $ZnCl_2$, $ZnMe_2$, $ZnEt_2$, $H_2O$, $O_3$, $O_2$ plasma and oxygen radicals, where the Zn element comes from $ZnCl_2$, $ZnMe_2$ or $ZnEt_2$; the O element comes from $H_2O$, $O_3$, $O_2$ plasma or oxygen radicals.

In one embodiment, if the buffer layer 12 is deposited by the atomic layer deposition process and the buffer layer 12 is formed of $Mg_xZn_{1-x}O$, then the precursors of the buffer layer 22 of $Mg_xZn_{1-x}O$ can be $ZnCl_2$, $ZnMe_2$, $ZnEt_2$, $MgCp_2$, $Mg(thd)_2$, $H_2O$, $O_3$, $O_2$ plasma and oxygen radicals, where the Mg element comes from $MgCp_2$ or $Mg(thd)_2$; the Zn element comes from $ZnCl_2$, $ZnMe_2$, or $ZnEt_2$; and the O element comes from $H_2O$, $O_3$, $O_2$ plasma or oxygen radicals.

Taking the deposition of the buffer layer of ZnO as an example, an atomic layer deposition cycle includes four reaction steps of:

1. Using a carrier gas to carry $H_2O$ molecules into the reaction chamber, thereby the $H_2O$ molecules are absorbed on the upper surface of the substrate to form a layer of OH radicals, where the exposure period is 0.1 second;

2. Using a carrier gas to purge the $H_2O$ molecules not absorbed on the upper surface 100 of the substrate 10, where the purge time is 5 seconds;

3. Using a carrier gas to carry $ZnEt_2$ molecules into the reaction chamber, thereby the $ZnEt_2$ molecules react with the OH radicals absorbed on the upper surface of the substrate to form one monolayer of ZnO, wherein a by-product is organic molecules, where the exposure period is 0.1 second; and 4. Using a carrier gas to purge the residual $ZnEt_2$ molecules and the by-product due to the reaction, where the purge time is 5 seconds.

The carrier gas can be highly-pure argon or nitrogen. The above four steps, called one cycle of the atomic layer deposition, grows a thin film with single-atomic-layer thickness on the whole area of the substrate. The property is called self-limiting capable of controlling the film thickness with a precision of one atomic layer in the atomic layer deposition. Thus, controlling the number of cycles of atomic layer deposition can precisely control the thickness of the ZnO buffer layer.

In conclusion, the atomic layer deposition process adopted by the invention has the following advantages: (1) able to control the formation of the material in nano-metric scale; (2) able to control the film thickness more precisely; (3) able to have large-area production; (4) having excellent uniformity; (5) having excellent conformality; (6) pinhole-free structure; (7) having low defect density; and (8) low deposition temperature, etc.

Figure 1C:
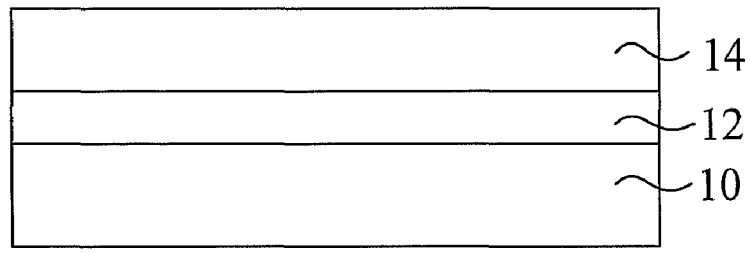

Afterwards, as shown in FIG. 1C, a semiconductor material layer 14 can be deposited on the buffer layer 12. The buffer layer 12 can assist the epitaxial growth of the semiconductor material layer 14 and also can serve as a lift-off layer. In one embodiment, the semiconductor material layer 14 may have a thickness in a range of 1 μm to 500 μm.

In practical applications, the semiconductor material layer 14 can be made of GaN, InGaN, AlN or AlGaN. In this embodiment, the semiconductor material layer 14 can be made of GaN, and the GaN layer can be deposited by an MOCVD (metalorganic chemical vapor deposition) process or an HVPE (hydride vapor phase epitaxy) process.

Figure 1D:
Figure 1D:
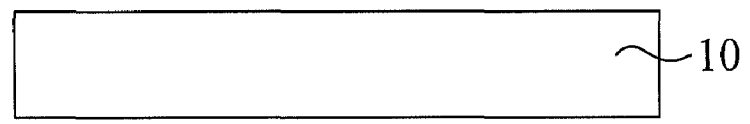

Next, as shown in FIG. 1D, only the lift-off layer can be etched by an etching solution to debond the second substrate 10 away from the semiconductor material layer 14.

In this embodiment, if the buffer layer 12 is formed of ZnO, then the etching solution can be a hydrofluoric acid solution, a hydrochloric acid solution, a nitric acid solution, or a phosphoric acid solution. In practical applications, the etching solution can be chosen in accordance with the material of the buffer layer 12. In principle, the etching solution can only etch the buffer layer 12 which serves as the lift-off layer.

Figure 2A:
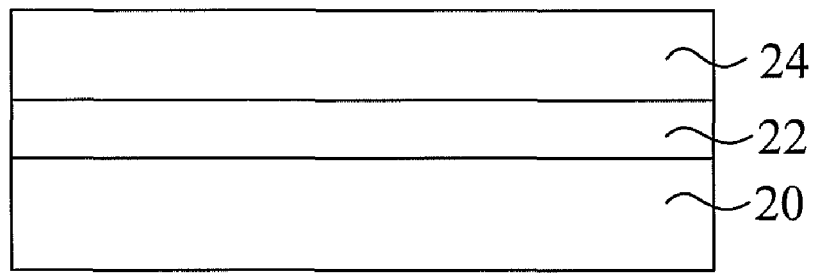
FIG. 2A and FIG. 2B are sectional views illustrating a method of recycling a second substrate during fabrication of a first substrate in accordance with another embodiment of the invention.
Figure 2B:
Figure 2B:

Please refer to FIG. 2A and FIG. 2B. FIG. 2A and FIG. 2B are sectional views illustrating a method of recycling a second substrate during fabrication of a first substrate in accordance with another embodiment of the invention.

As shown in FIG. 2A, a buffer layer 22 can be deposited on the second substrate 20, and a semiconductor material layer 24 can be deposited on the buffer layer 22. The buffer layer 22 can assist the epitaxial growth of the semiconductor material layer 24 and also can serve as a lift-off layer.

As shown in FIG. 2B, only the lift-off layer can be etched by an etching solution to debond the second substrate 20 away from the semiconductor material layer 24, and further to recycle the substrate 20, wherein the semiconductor material layer 24 can serve as the first substrate.

Compared to the prior art, according to the method of the invention, only the lift-off layer can be etched by the etching solution to debond the second substrate away from the semiconductor material layer, wherein the second substrate can further be recycled and the semiconductor material layer can sever as the first substrate for production of a semiconductor optoelectronic device. Preferably, the recycling of the second substrate can reduce the manufacture cost and economize the use of materials.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating a first substrate, comprising the steps of:
    preparing a second substrate;
    using an atomic layer deposition process to deposit a $Mg_xZn_{1-x}O$ buffer layer on the second substrate, wherein $0 \leq x \leq 1$;
    depositing a semiconductor material layer on the $Mg_xZn_{1-x}O$ buffer layer, the $Mg_xZn_{1-x}O$ buffer layer assisting the epitaxial growth of the semiconductor material layer and also serving as a lift-off layer; and
    with an etching solution, only etching the lift-off layer to debond the second substrate away from the semiconductor material layer and to retain whole of the semiconductor material layer and the second substrate, wherein the semiconductor material layer serves as the first substrate.

2. The method of claim 1, wherein the semiconductor material layer is formed of a material selected from the group consisting of GaN, InGaN, MN and AlGaN.

3. The method of claim 1, wherein the etching solution is a hydrofluoric acid solution, a hydrochloric acid solution, a nitric acid solution, or a phosphoric acid solution.

4. The method of claim 1, wherein the buffer layer is deposited by one selected from the group consisting of a sputtering process, an MOCVD (metal organic chemical vapor deposition) process, an atomic layer deposition process, a plasma-enhanced atomic layer deposition process, and a plasma-assisted atomic layer deposition process.

5. The method of claim 1, wherein the semiconductor material layer has a thickness in a range of 1 μm to 500 μm.

6. The method of claim 1, wherein the buffer layer has a thickness in a range of 10 nm to 500 nm.

7. The method of claim 1, wherein the second substrate is formed of a material selected from the group consisting of sapphire, Si, SiC, GaN, ZnO, $ScAlMgO_4$, YSZ (Yttria-Stabilized Zirconia), $SrCu_2O_2$, $LiGaO_2$, $LiAlO_2$, and GaAs.

* * * * *